(12) United States Patent
Jovanovic et al.

(10) Patent No.: US 7,301,358 B2
(45) Date of Patent: Nov. 27, 2007

(54) CONTACTOR ASSEMBLY FOR TESTING ELECTRICAL CIRCUITS

(75) Inventors: Jovan Jovanovic, Santa Clara, CA (US); Frank O. Uher, Los Altos, CA (US); Donald P. Richmond, II, Palo Alto, CA (US)

(73) Assignee: Aehr Test Systems, Fremont, CA (US)

( * ) Notice: Subject to any disclaimer, the term of this patent is extended or adjusted under 35 U.S.C. 154(b) by 95 days.

(21) Appl. No.: 10/971,897

(22) Filed: Oct. 22, 2004

(65) Prior Publication Data

US 2005/0057270 A1     Mar. 17, 2005

Related U.S. Application Data

(62) Division of application No. 10/197,133, filed on Jul. 16, 2002, now Pat. No. 6,853,209.

(51) Int. Cl.
*G01R 31/02* (2006.01)
(52) U.S. Cl. .................. 324/758; 324/754
(58) Field of Classification Search ........... 439/65–75; 324/754, 755, 758, 765
See application file for complete search history.

(56) References Cited

U.S. PATENT DOCUMENTS

| | | | |
|---|---|---|---|
| 5,037,312 A | 8/1991 | Casciotti et al. | |
| 5,061,192 A * | 10/1991 | Chapin et al. | 439/66 |
| 5,163,834 A | 11/1992 | Chapin et al. | |
| 5,974,662 A * | 11/1999 | Eldridge et al. | 29/842 |
| 6,312,266 B1 | 11/2001 | Fan et al. | |
| 6,354,844 B1 | 3/2002 | Coico et al. | |
| 6,509,751 B1 * | 1/2003 | Mathieu et al. | 324/754 |
| 7,108,546 B2 * | 9/2006 | Miller et al. | 439/578 |
| 2002/0132501 A1 * | 9/2002 | Eldridge et al. | 439/66 |

FOREIGN PATENT DOCUMENTS

WO     WO 0109623 A1 *  2/2001

\* cited by examiner

*Primary Examiner*—Minh N. Tang
(74) *Attorney, Agent, or Firm*—Blakely, Sokoloff, Taylor & Zafman; Stephen M. De Klerk

(57) ABSTRACT

A method of assembling a test contactor is described. The method includes aligning an interposer and an electrical contactor wherein resilient interconnection elements of the interposer are resiliently deformed into a deformed state to make electrical contact with corresponding electrical terminals on the electrical contactor; and securing the interposer and the electrical contactor together to lock the resilient interconnection elements in said deformed state.

8 Claims, 11 Drawing Sheets

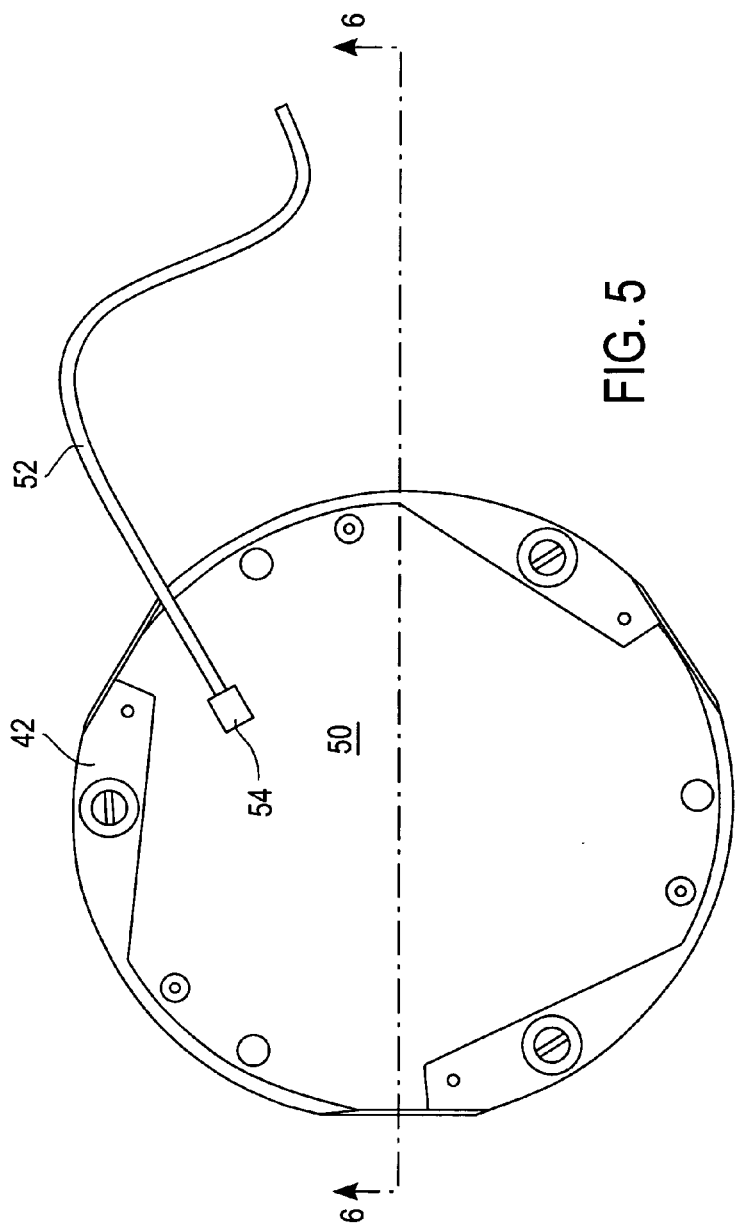
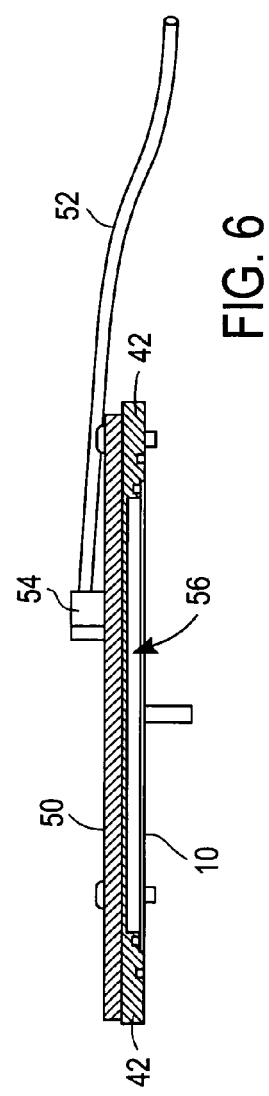
FIG. 5
FIG. 6

CONTACTOR ASSEMBLY FOR TESTING ELECTRICAL CIRCUITS

This Application is a divisional of U.S. patent application Ser. No. 10/197,133, filed on Jul. 16, 2002, which issued as U.S. Pat. No. 6,853,209 on Feb. 8, 2005.

FIELD OF THE INVENTION

This invention relates to test equipment. In particular, it relates to test equipment for testing electrical circuits including integrated circuits.

BACKGROUND

When fabrication of electronic devices, such as computer processors and memories, have been completed, the electronic devices are subjected to burn-in and electrical testing in order to identify and eliminate defective devices before shipment. The term "burn-in" relates to operation of an integrated circuit at a predetermined temperature or temperature profile, typically an elevated temperature in an oven. Certain operating electrical bias levels and/or signals are supplied to the electronic devices while they are at the elevated temperature. The use of the elevated temperature accelerates stress to which the devices are subjected during burn-in, so that marginal devices that would otherwise fail shortly after being placed in service fail during burn-in, and are therefore not shipped.

Test equipment for burn-in testing of electrical circuits generally comprise a connection arrangement for electrically connecting an electrical circuit to be tested such as an integrated circuit on a wafer or test substrate, to a test probe circuit.

SUMMARY

In one embodiment, the invention provides a contactor assembly for use in testing electrical circuits. The contactor assembly comprises an electrical contactor including a contactor substrate, and a plurality of electrical terminals; an interposer including an interposer substrate having first and second sides, a plurality of first and second resilient interconnection elements extending respectively from the first and second sides of the interposer substrate, wherein the interposer is positioned in a predetermined position relative to the electrical contactor in which predetermined position each first resilient interconnection element makes electrical contact with an electrical terminal of the electrical contactor, the interposer substrate having been moved relatively towards the contactor substrate to resiliently deform the first resilient interconnection spring elements; and a retaining component having a first portion secured to the electrical contactor and a second portion in contact with the interposer to retain the interposer in the predetermined position relative to the electrical contactor.

BRIEF DESCRIPTION OF THE DRAWINGS

The invention is described by way of example with reference to the accompanying drawings wherein:

FIG. 5 is a top plan view of the vacuum plate and ring of FIG. 4;

FIG. 6 is a section on 6-6 in FIG. 5;

DETAILED DESCRIPTION

Figure 1:
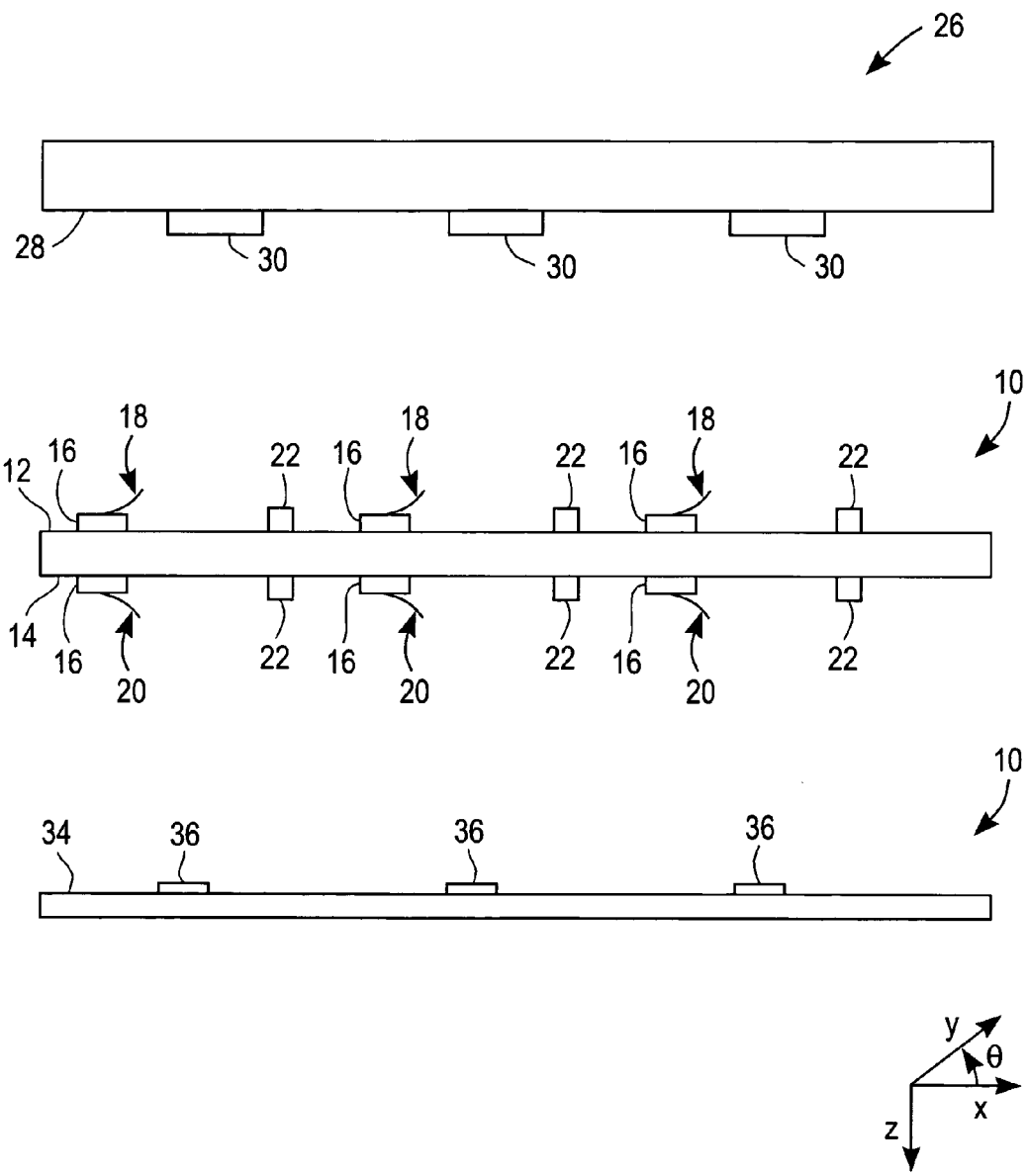
FIG. 1 is a block diagram of an interposer, an electrical contactor and a wafer comprising circuits to be tested.

FIG. 1 of the accompanying drawings illustrates an interposer 10 and an electrical contactor 26 which together form a contactor assembly, according to an embodiment of the invention, used to test electrical circuits, for example, on a wafer 32.

As will be seen from FIG. 1, the interposer 10 includes a substrate having a first side 12 and a second side 14. The interposer 10 includes a number of electrical terminals 16 on the first side 12. The interposer 10 also includes resilient interconnection elements in the form of interconnection spring elements 18. Each interconnection spring element 18 extends from an electrical terminal 16 on the side 12 and terminates in a free end. The purpose of each interconnection spring elements 16 is to make good electrical contact with corresponding electrical terminals on the electrical contactor 26. In other embodiments, the resilient interconnection elements include pogo pins and compliant conductive bumps.

The interposer 10 also has an interconnection spring element 20 on each electrical terminal 16 on side 14. The interconnection spring elements 20 are similar to the interconnection spring elements 18 except that the interconnection spring elements 20 are for making electrical contact with corresponding electrical terminals on the wafer 32.

The interposer also includes mechanical stops 22 on the sides 12 and 14 to prevent overtravel of the interconnection spring elements 18 and to prevent the interposer from touching certain areas of the wafer 32.

The electrical contactor 26 includes a contactor substrate which includes a side 28. Electrical contactor 26 also includes electrical terminals 30 on the side 28.

The wafer 32 is shown to include a side 34 which has the electrical circuits to be tested. The wafer 32 has electrical terminals 36 on the side 34 whereby electrical connection to the electrical circuits may be made.

Figure 2:
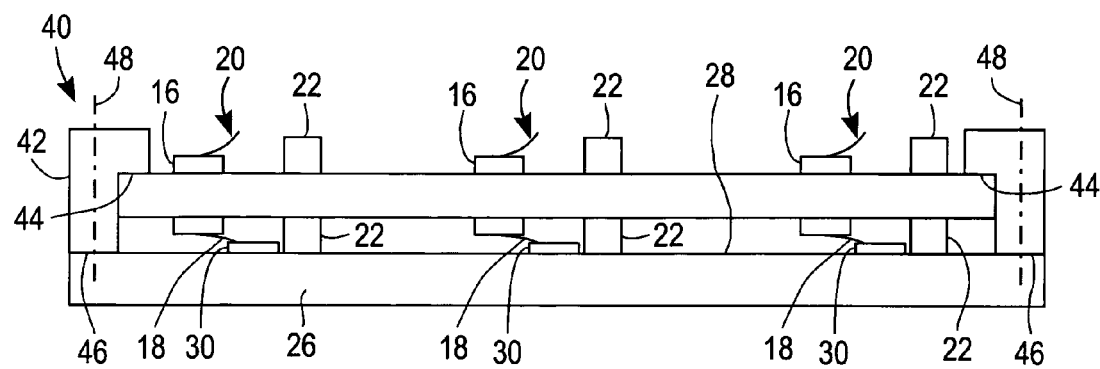
FIG. 2 is a block diagram of a contactor assembly in accordance with one embodiment of the invention.
Figure 2:

FIG. 2 of the drawings shows a contactor assembly 40 in accordance with one embodiment of the invention. The assembly 40 includes an interposer 10 and a retaining component in the form of a ring 42. The interposer 10 is secured or held in a predetermined z position relative to the electrical contactor 26 by a ring 42. It will be seen that in the predetermined or aligned position, each interconnection spring element 18 has been deformed against a spring force thereof to make electrical contact with a corresponding electrical terminal 30 of electrical contactor 26. The predetermined z position is reached by moving the ring 42 and the interposer 10 seated therein until the stops 22 bear against the side 28 of the electrical contactor 26. In other embodiments, the predetermined position is reached when sufficient pressure is exerted by the interconnection spring elements 18 (or the pogo pins or compliant conductive bumps in other embodiments) to keep the contactor 26 in place. The stops 22 are thus optional. A spacing between the interposer 10 and the electrical contactor 26 is such that each of the interconnection spring elements 18 is under compression.

Figure 4:
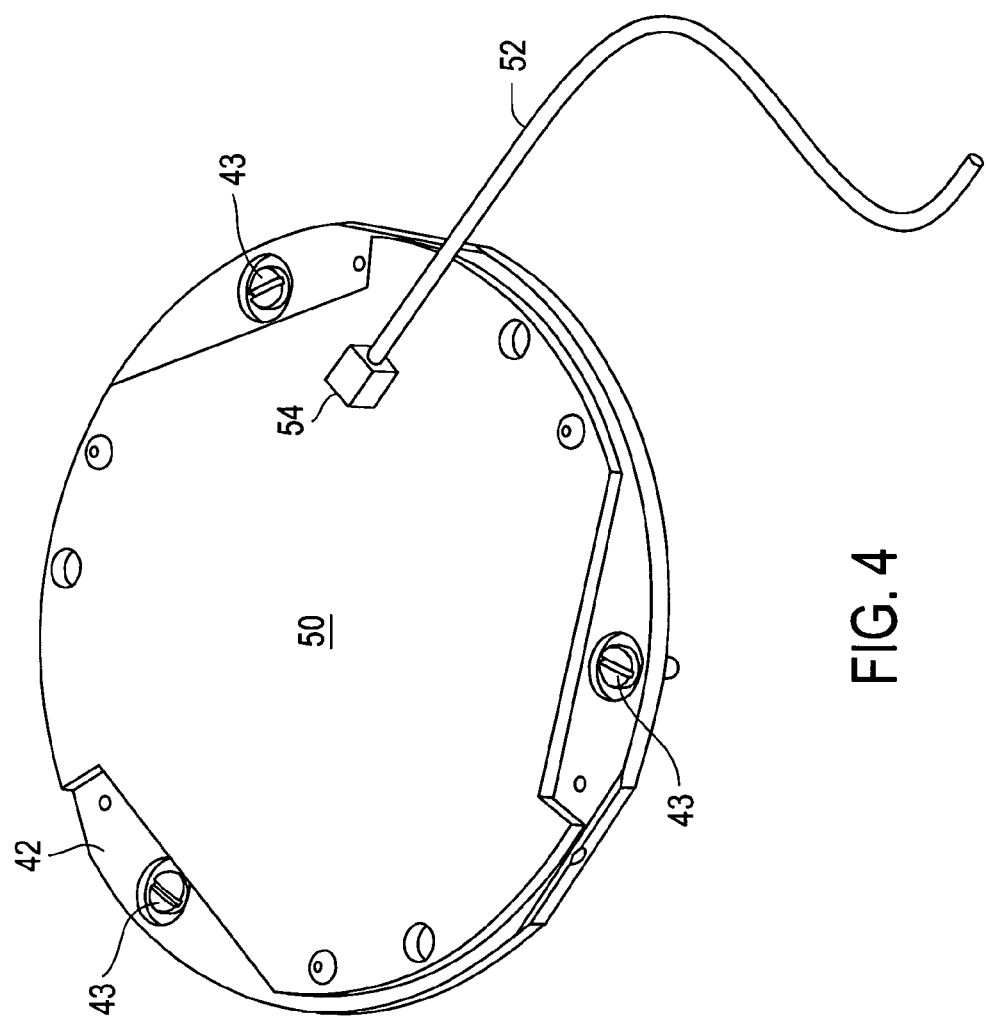
FIG. 4 is a perspective view of a vacuum plate connected to a ring, in accordance with one embodiment of the invention.

The ring 42 is formed with a recessed surface 44 which defines a seat for the interposer 10. The ring 42 has a flat flange-like face 46 which bears against side 28 of electrical contactor 26. The ring 42 is secured to the electrical contactor 26 by means of fasteners 43, for example screws, extending through screw holes 48 (see FIG. 4). The holes 48 are dimensioned to accommodate the fasteners 43 with some degree of play to permit alignment of fiducial markings on the interposer 10 and contactor 26, respectively.

Figure 3:
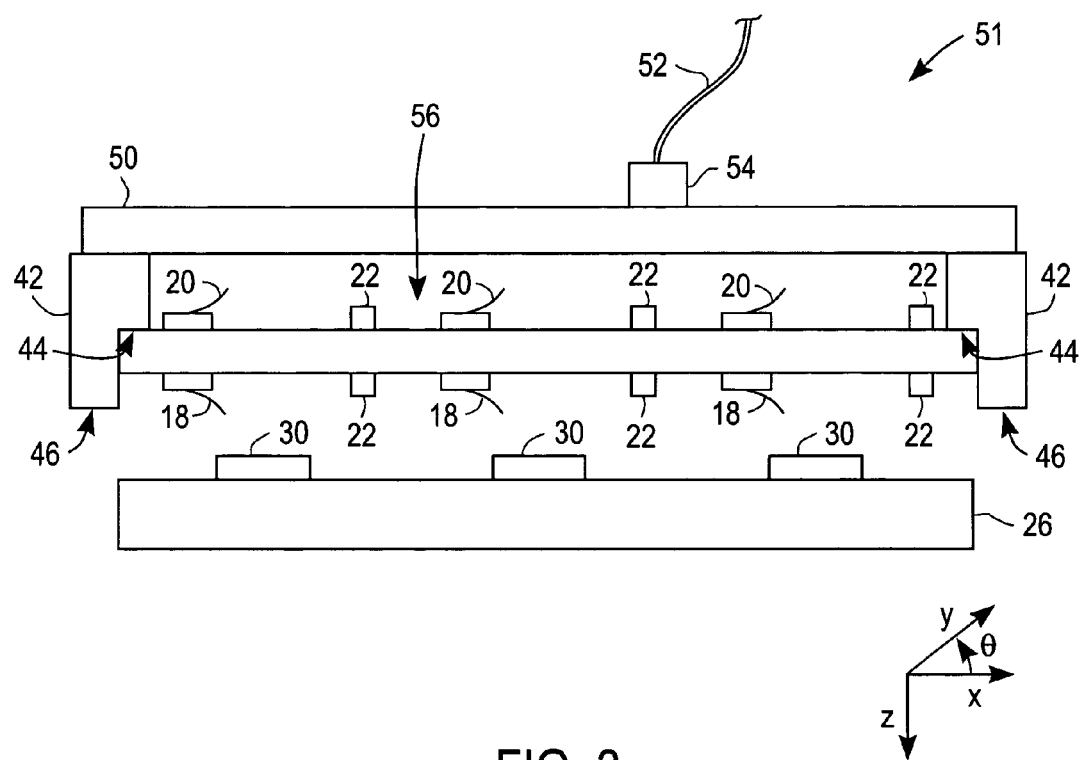
FIG. 3 is a block diagram illustrating a stage in the formation of the contactor assembly of FIG. 2.

FIG. 3 of the drawings shows a first stage in the formation of the contactor assembly 40. Referring to FIG. 3, a vacuum plate 50 is releasably secured to a side of the ring 42 opposing face 46 to form a sub-assembly 51. The vacuum plate 50 can be connected to a pump (not shown) by means of a coupling 54 and a hose 52 connected to the coupling 54. In use, the pump creates a vacuum in a region 56 between the vacuum plate 50 the interposer 10. The vacuum retains interposer 10 against the recessed surface 44. As can be seen from FIGS. 4 and 5, the vacuum plate 50 is shaped and dimensioned to provide access to the fasteners 43.

As can be seen from FIG. 6 which shows a sectional view through sub-assembly 51 taken at 6-6 in FIG. 5, the interposer 10 seats snugly in the ring 42.

Figure 7:
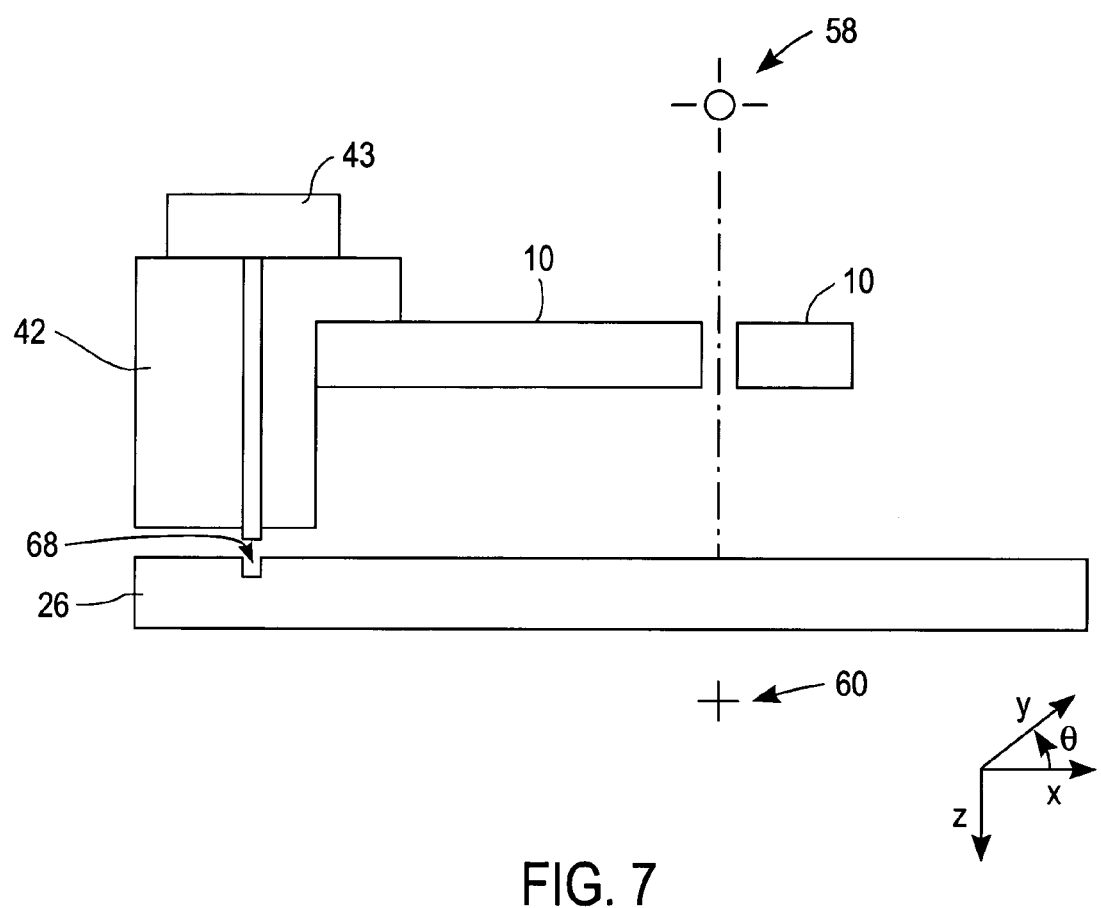
FIG. 7 is a block diagram illustrating how a ring and interposer seated therein may be aligned with a contactor, in accordance with one embodiment of the invention.

FIG. 7 of the drawings shows a block diagram of how alignment of the interposer 10 with the electrical contactor 26 is achieved. The interposer 10 is seated in the ring 42 and moved in an x, y, or θ) direction such that a fiducial marking 58 on the side 14 of the interposer 10 is aligned with a fiducial marking 60 on the side 28 of the electrical contactor 26. Once the fiducial marking 58 is aligned with the fiducial marking 60, the ring 42 together with the interposer 10 is displaced in a z direction so that the ring 42 makes contact with the electrical contactor 26. A screw 43 located in hole 48 is then screw-threaded into a complementary threaded socket 68 formed in electrical contactor 26. The fiducial markings 58, 60 allow for alignment for the electrical terminals 30 on the electrical contactor 26 with the ends of the interconnection spring elements 18 without having to take an image of the interconnection spring elements 18. Tolerances in the position of each interconnection spring element in the x-y plane or the angle at which it projects from the x-y plane do not effect the alignment process. The mechanical stops 22 on the side 18 of the interposer 10 may be used to limit movement of the interposer 10 towards the electrical contactor 26 when forming the assembly 40, such that each of the interconnection spring elements 18 is under the desired compression.

Figure 8:
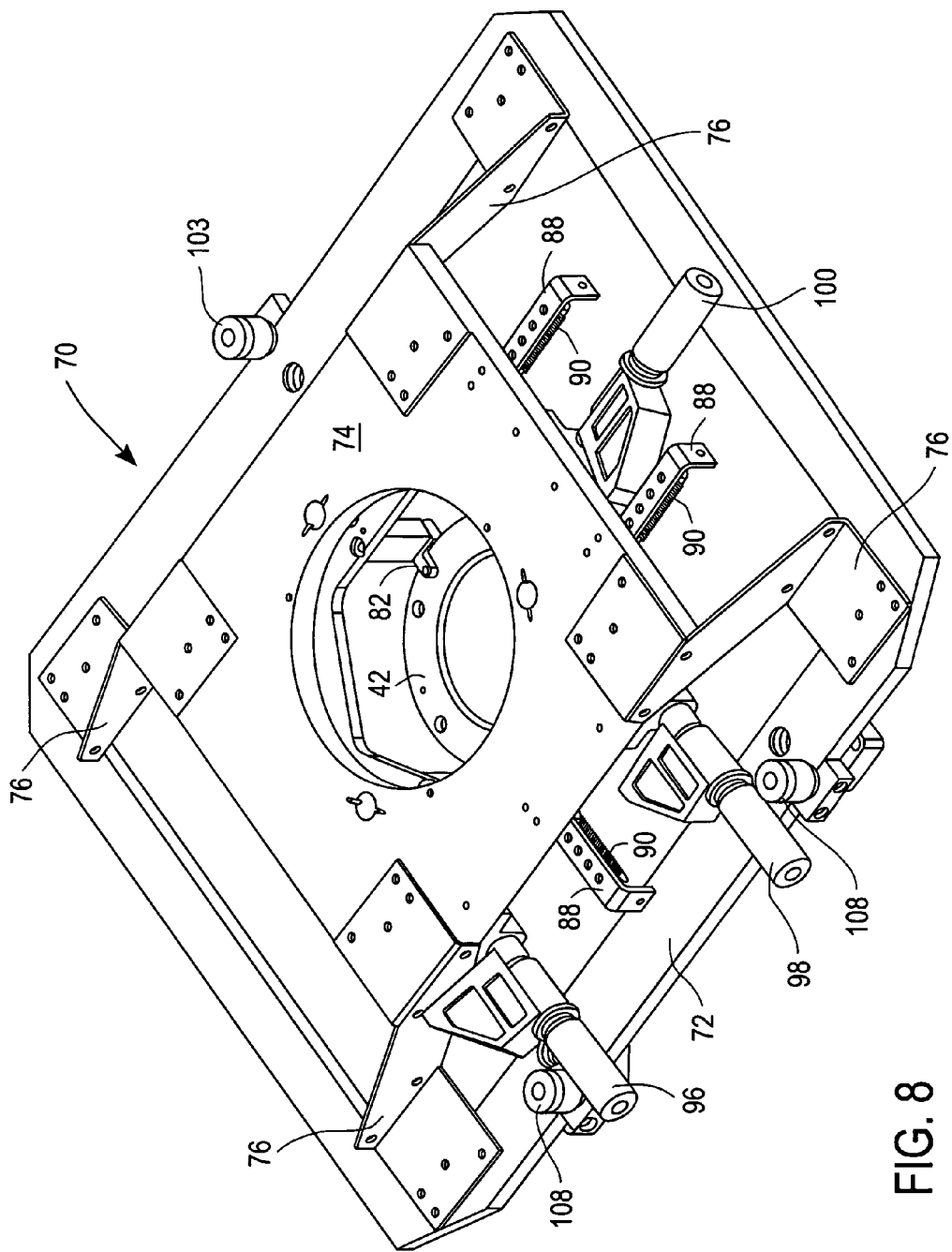
FIG. 8 is a perspective view of an alignment machine in accordance with one embodiment of the invention.
Figure 9:
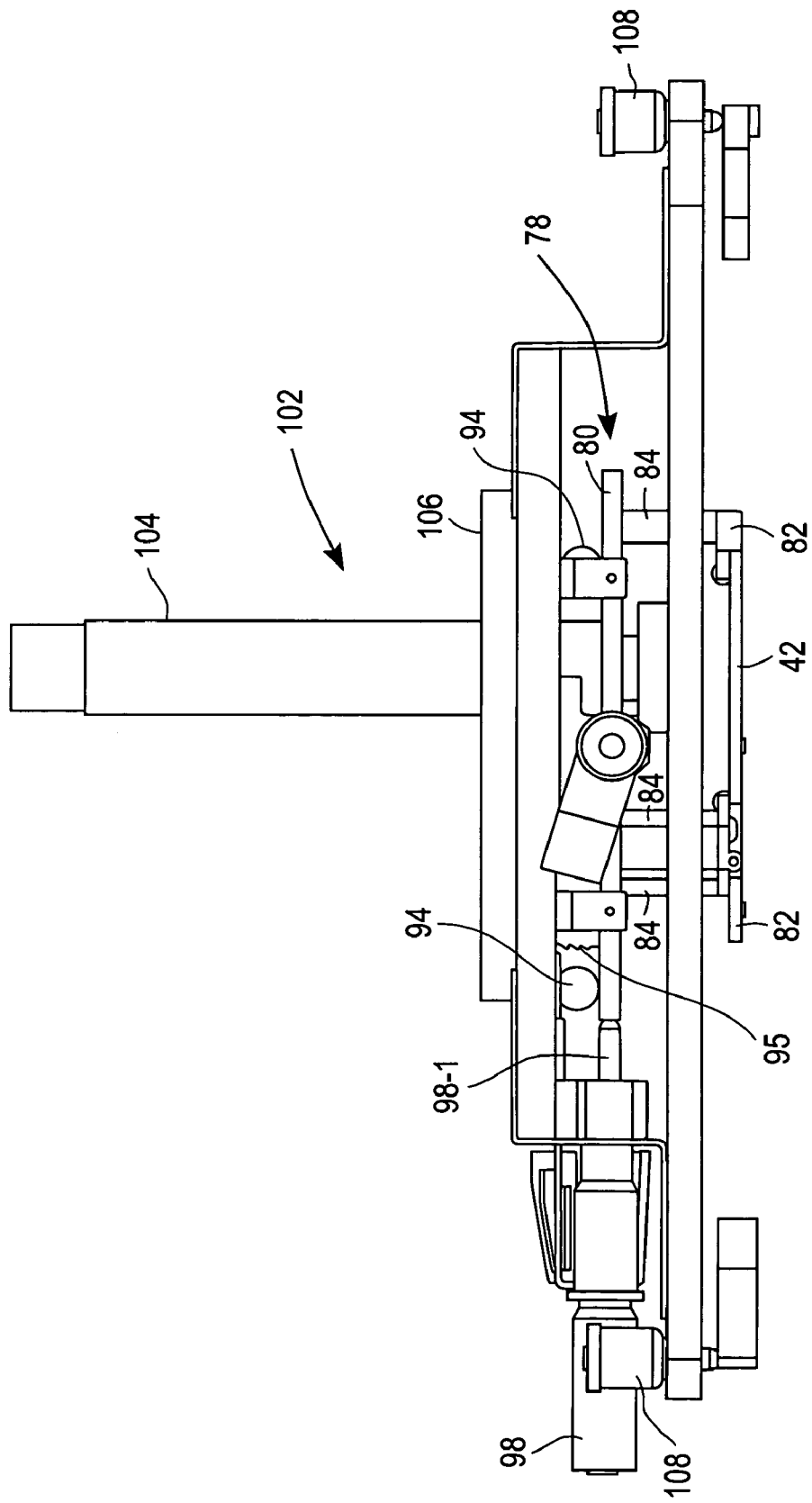
FIG. 9 is an end view of the alignment machine shown in FIG. 8 of the drawings with a microscope mounted thereon.

FIG. 8 of the drawings shows a perspective view of an alignment machine 70, in accordance with one embodiment of the invention, which may be used to align the ring 42 and interposer 10 combination with the electrical contactor 26. The alignment machine 70 includes a base 72 which is shaped and dimensioned to rest on a probe plate 152 which, in use, houses the electrical contactor 26. The alignment machine 70 also includes a raised platform or plate 74 which is secured to the base 72 by means of mounting brackets 76. The platform 74 supports a carriage 78. The carriage 78 is seen in FIG. 9 of the drawings which shows a side view of the alignment machine 70. The carriage 78 is secured to an underside of the platform 74 by means of a mounting arrangement comprising angle brackets 88 and horizontal springs 90. The angle brackets 88 are secured to the platform 74 and provide an anchor for one end of the springs 90, the other end of the springs 90 being secured to a floating plate 80 of carriage 78 as can be seen in FIG. 9 of the drawings.

The carriage 78 further includes ring holders 82 which are secured to the floating plate 80 of vertical members 84 extending between the ring holders 82 and the floating plate 80.

Roller bearings 94 disposed between the platform 74 and the floating plate 80 allow for slideable displacement of the floating plate 80 relative to the platform 74. Vertical springs 95 urge the floating plate 80 into contact with roller bearings 94. It will be appreciated that the spring mounting arrangement of the floating plate 80 to the platform 74 allows for movement of the floating plate 80 in an x-y plane. Such movement in the x y plane is controlled by means of an adjustment mechanism which, in one embodiment, includes micrometers 96, 98, and 100, each of which can be operated to urge a tip thereof to bear against an edge of the floating plate 80 thereby to cause the displacement of floating plate 80. For example, as can be seen in FIG. 9 of the drawings, a tip 98.1 of the micrometer 98 may be displaced in a y direction to bear against an edge of the floating plate 80 thereby to cause the floating plate 80 to be displaced in the y direction. Because the ring holders 82 are rigidly connected to the floating plate 80, displacement of the floating plate 80 also causes corresponding displacement of the ring holders 82.

Figure 10:
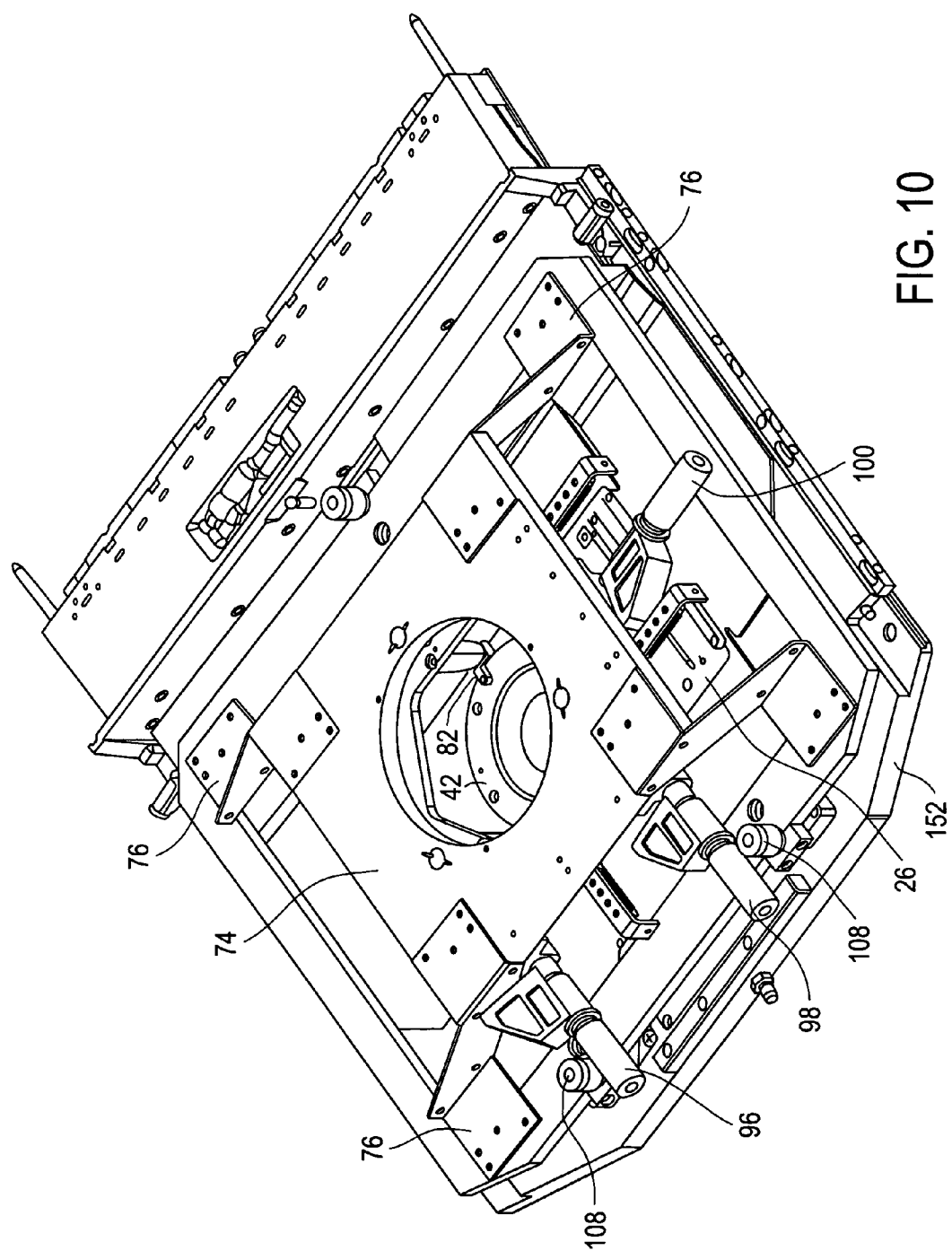
FIG. 10 is a perspective view of the alignment machine of FIG. 8 mounted on a probe plate.
Figure 11:
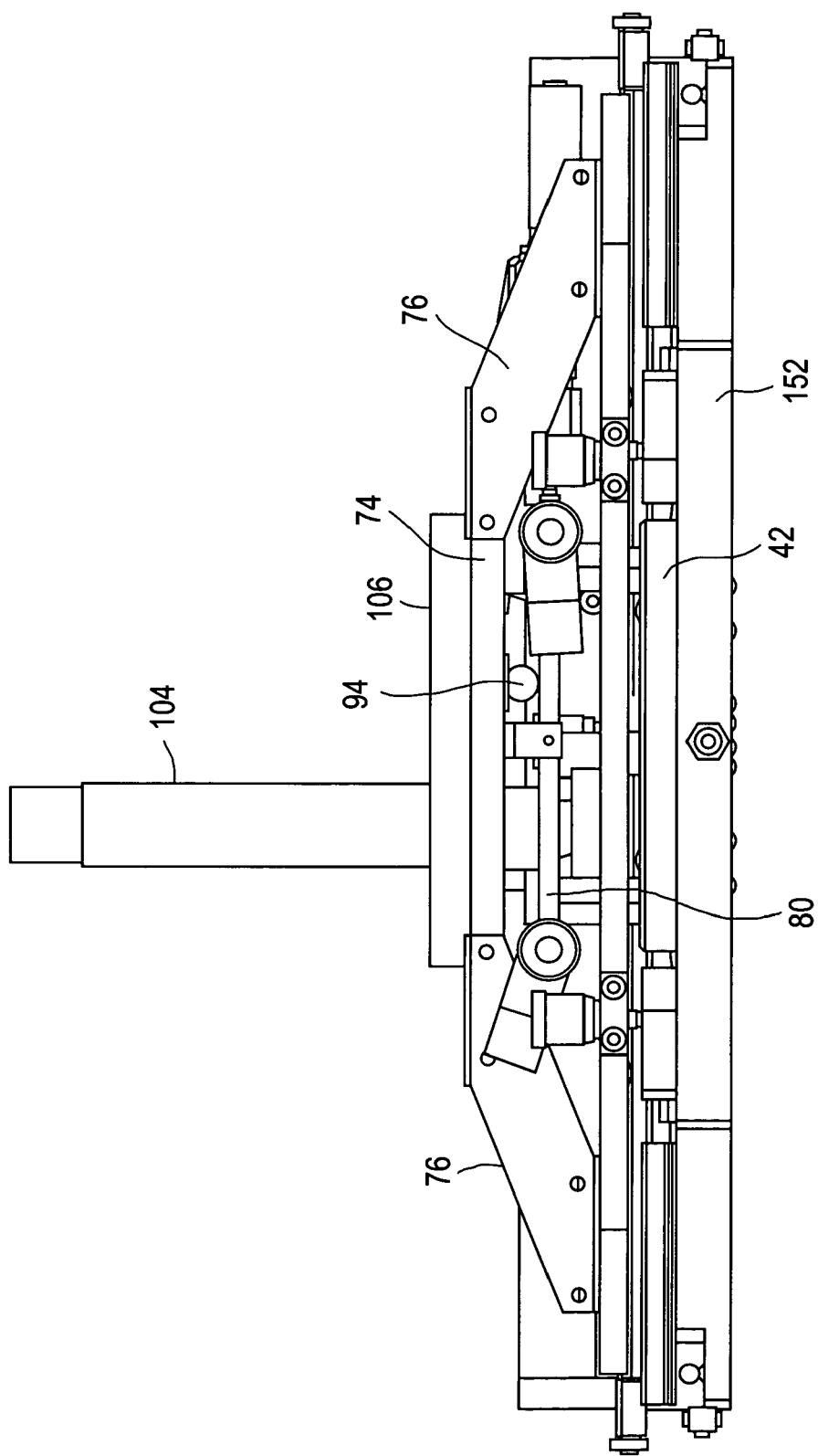
FIG. 11 is an end view of FIG. 10.

In use, the interposer 10 which is seated in the ring 42 by means of a suction force created with the aid of the vacuum plate 50 and a pump (not shown) is connected mechanically to the ring holders 82 of the carriage 78. Thereafter, the alignment machine 70 is positioned on a probe plate 152 as is shown in FIG. 10. In this position, the ring 42 and the interposer 10 which is seated in the ring 42 is positioned directly over the electrical connector 26 which is seated in the probe plate 152.

A magnification system comprising a microscope 102 which includes a scope section 104 and a base 106 is secured on the platform 74 as can be seen in FIG. 9 of the drawings.

The microscope 102 magnifies the fiducial markings 58, 60 on the interposer 10 and the electrical connector 26, respectively. The micrometers 96, 98 and 100 may then be operated to move the carriage 78, which carries the ring 42 and the interposer 10 with it, so that the interposer 10 may be positioned over the electrical connector 26 in a predetermined or aligned position in which the fiducial markings, 58, 60 on the interposer 10 and the electrical contactor 26, respectively, are in alignment.

The alignment machine 70, further includes micrometer heads 108 which may be operated to move the carriage 78 in a z direction which causes the interposer and ring combination to be displaced in the z direction towards the electrical contactor 26. In use, displacement in the z direction is continued until the stops 22 contact the side 28 of electrical contactor 26, or the desired z position is reached. When this position is reached, the screws 43 are screwed into the sockets 68 in the electrical contactor 26, thereby to secure the ring 42 and the interposer 10 seated therein to the electrical contactor 26.

Once the ring 42 and the interposer 10 are secured to the electrical contactor 26, the vacuum plate 50 and the alignment machine 70 are removed. The probe plate 152 may then be aligned to a wafer 32. Thereafter, the probe pate 152 may be secured to a chuck plate 154 which carries the wafer 32 (see FIG. 12 of the drawings).

Figure 12:
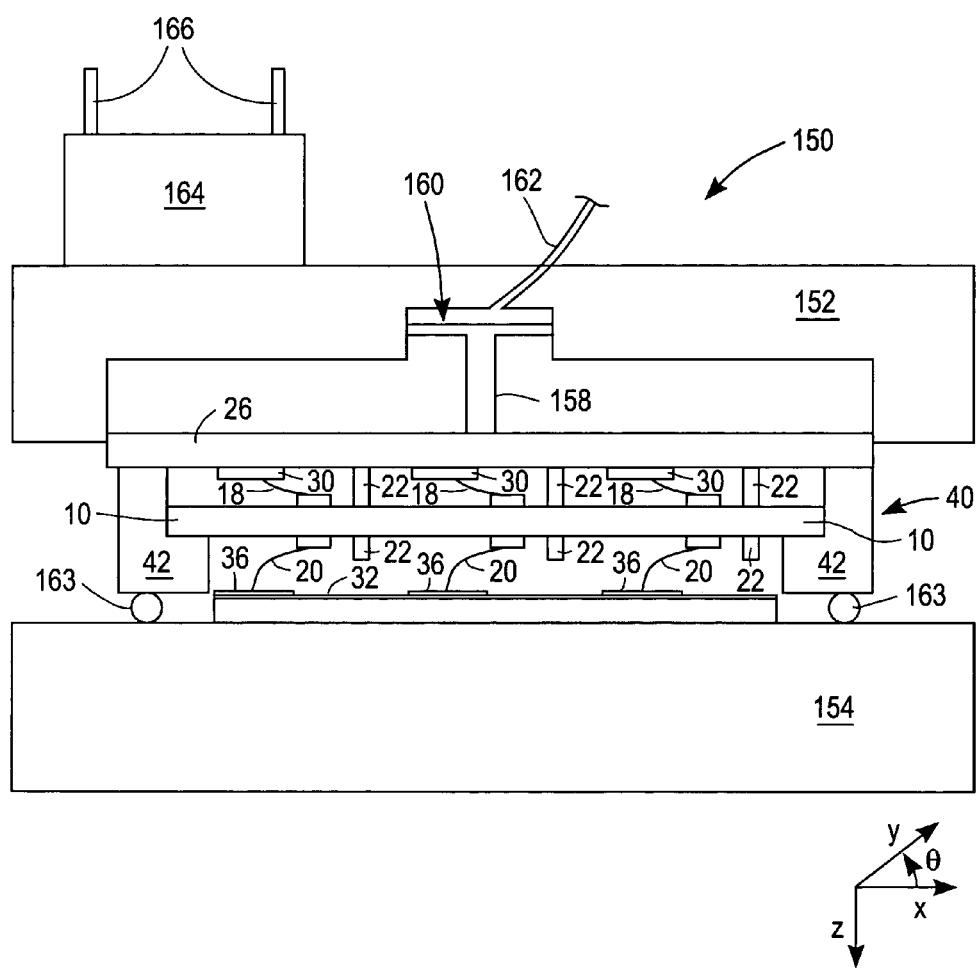
FIG. 12 is a block diagram of a test probe assembly in accordance with one embodiment of the invention.

FIG. 12 of the drawings illustrates the components of test probe assembly 150 in accordance with one embodiment of the invention. The test probe assembly 150 includes a probe plate 152 and a chuck plate 154 which together define a space therebetween for receiving a contactor assembly such as the contactor assembly 40 shown in FIG. 2 of the drawings.

The chuck plate 154 has a pedestal 156 which provides support for the wafer 32. The probe plate 152 includes a piston 158 which is displaceable in a cylinder 160 by a pneumatic (air) means which, in use, is introduced into the chamber 160 through a hose 162 which is releasably connectable to the cylinder 160. The piston 158 is urged against an electrical contactor 26 of the contactor assembly 40.

In use, air is introduced into the chamber 160 through hose 162 to urge the piston 158 to move in a z direction, thereby to displace the contactor assembly 40 towards the chuck plate 154 until the mechanical alignment stops 22 on the side 14 of the interposer 10 make contact with the side 34 of the wafer 32. A resiliently deformable member in the form of an O-ring 163 positioned between the ring 42 and the chuck plate 154 serves to limit or control how much displacement of the contactor assembly 40 is produced by movement of the piston 158. Thus, movement of the piston 158 does not require precise control. Further, the O-ring 163 provides a seal between the ring 42 and the chuck plate 154. The O-ring 163 also allows for variations in which the faces 46 of the ring 42 may not be on the same z-plane by cushioning the ring 42 as it is displaced towards the chuck plate 154. In some embodiments, the O-ring 163 may be replaced by springs which provide a reaction against movement of the piston 158. Once the mechanical stops 22 of the side 14 of the interposer 10 contact the side 34 of the wafer 32, the interconnection spring elements are compressed thereby to achieve good electrical contact between the interconnection spring elements 20 of the interposer 10 and the electrical terminals 36 of the wafer 32. Thereafter, the hose 162 may be removed. The probe assembly 152 may also include a securing mechanism to releasably secure or fasten the chuck plate 154 to the probe plate 152. The securing mechanism has not been shown in FIG. 12, but includes any suitable clamping arrangement such as the kinematic couplings of U.S. Pat. No. 6,340,895 which is hereby incorporated by reference. The test probe assembly 150 may then be inserted into a test burn-in chamber wherein electrical connection pins 166 of an external interface component 164 are received in complementary electrical sockets.

Alternatively, the chuck plate 152 may be an integral part of a test probe unit, and the burn-in testing may be done with the test probe assembly in position above the chuck plate 152 on the test probe unit.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A method of assembling a test contactor, the method comprising:

aligning an interposer and an electrical contactor wherein resilient interconnection elements of the interposer are resiliently deformed into a deformed state to make electrical contact with corresponding electrical terminals on the electrical contactor; and securing the interposer and the electrical contactor together to lock the resilient interconnection elements in said deformed state.

2. The method of claim 1, wherein aligning the interposer comprises first aligning the interposer in an x-y plane over the electrical contactor to a first position in which each resilient interconnection element of the interposer is aligned with a corresponding electrical terminal on the electrical contactor; and then displacing the interposer in a z direction to a second position in which each resilient interconnection element of the interposer makes contact with the corresponding electrical terminal on the electrical contactor.

3. The method of claim 2, wherein aligning the interposer further comprises displacing the interposer in the z direction to a third position wherein each resilient interconnection element of the interposer is under compression.

4. The method of claim 3, wherein the interposer is in the third position when stops on the interposer make contact with the electrical contactor.

5. The method of claim 2, wherein aligning the interposer in the x-y plane comprises displacing the interposer in an x, y, or a θ direction.

6. The method of claim 2, wherein aligning the interposer in the x-y plane comprises aligning fiducial markings on the interposer and the electrical contactor respectively.

7. The method of claim 1, wherein the resilient interconnection elements are evenly deformed relative to each other in the deformed state.

8. The method of claim 1, wherein the resilient interconnection elements extend from a first side of the interposer and securing the interposer and the electrical contactor together comprises securing the interposer and electrical contactor together without deforming resilient interconnection elements extending from a second side of the interposer.

* * * * *